United States Patent
Chen et al.

(10) Patent No.: US 7,633,219 B2
(45) Date of Patent: Dec. 15, 2009

(54) RED PHOSPHOR AND WHITE LIGHT ILLUMINATION DEVICE UTILIZING THE SAME

(75) Inventors: Teng-Ming Chen, Hsinchu (TW); Yi-Chen Chiu, Hsinchu (TW); Shian-Jy Wang, Hsinchu (TW); Yao-Tsung Yeh, Taoyuan County (TW); Shyue-Ming Jang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 354 days.

(21) Appl. No.: 11/822,376

(22) Filed: Jul. 5, 2007

(65) Prior Publication Data

US 2008/0136310 A1 Jun. 12, 2008

(30) Foreign Application Priority Data

Dec. 7, 2006 (TW) .............................. 95145635 A

(51) Int. Cl.
*H01J 1/62* (2006.01)

(52) U.S. Cl. ................................. 313/503; 252/301.4 F

(58) Field of Classification Search ................. 313/486, 313/503
See application file for complete search history.

(56) References Cited

U.S. PATENT DOCUMENTS 6,501,100 B1 * 12/2002 Srivastava et al. ............. 257/79
6,616,862 B2 * 9/2003 Srivastava et al. ....... 252/301.4 P

OTHER PUBLICATIONS

K. Yamada et al., J. Ilium. Engng. Inst. Jpn. vol. 88 No. 5 2004 pp. 297-303.

* cited by examiner

*Primary Examiner*—Vip Patel
(74) *Attorney, Agent, or Firm*—Birch, Stewart, Kolasch & Birch, LLP

(57) ABSTRACT

The invention provides a red phosphor composed of $M(Eu_{1-x-y}La_xBi_y)_4Si_3O_{13}$, wherein M is Ca, Sr, Ba, or combinations thereof, $0<x<1$, and $0<y<1$. Under excitation of blue light or ultraviolet light, the red phosphor emits red light having a major emission peak of about 613 nm. The red phosphor of the invention may be collocated with green and blue phosphors to provide a white light illumination device.

13 Claims, 2 Drawing Sheets

RED PHOSPHOR AND WHITE LIGHT ILLUMINATION DEVICE UTILIZING THE SAME

BACKGROUND OF THE INVENTION

1. Field of the Invention

The present invention relates to a red phosphor, and in particular relates to a white light illumination device utilizing the same.

2. Description of the Related Art

The white light illumination device has been gradually replaced from conventional tungsten lamps or fluorescent lamps to commercially available light emitting diode (herein after LED). The LED has advantages described as follows: (1) its small size is suitable in illumination of array packaging and collocated with different colors if necessary; (2) a relatively long life of more than 10,000 hours and 50 times that of the conventional tungsten lamp; (3) durability due to transparent resin applied as packaging resin, thereby enhancing shock resistance; (4) its interior structure is free of mercury, such that the LED is environmental friendly and does not have problems such as pollution and waste management; (5) saves energy and consumes low electric power, wherein the electric power consumption of the LED is ⅓ to ⅕ that of the conventional tungsten lamp.

Generally, white light is a mixture of at least one colored light. For example, the white light seen by a human eye can be formed by mixing blue and yellow lights or mixing blue, green, and red lights. The former white light is a two-wavelength, and the latter is three-wavelength white light.

The three most common commercially available semiconductor white light devices are described as follows. The first is a white illumination device collocated by red, green, and blue LED chips. This white light module has high luminescence efficiency and high color rendering. However, the different color LED chips require different epitaxial materials, wherein different electrical voltages are needed. Accordingly, the manufacturing cost is high, the circuit layout is complicated, and the appropriate mixing of different color lights is difficult.

The second is a white illumination device disclosed by Nichia Corporation. The most common version is the white light formed by a yellow YAG phosphor excited by a blue LED. The periphery of the blue LED is filled with optical gel sealing the yellow YAG phosphor. The blue LED emits a blue light having a wavelength of about 400 nm to 530 nm. The yellow YAG phosphor is excited by a part of the blue light and then emits a yellow light. The remaining part of the blue light collocates with the yellow light to form the two-wavelength white light.

The described two-wavelength (blue and yellow) white LED has many illumination limitations. Because in this kind of two-wavelength white light, the color temperature is usually high and the color is not uniform. Therefore, the collocation of the blue light and the yellow phosphor needs to be improved to have higher color quality. Next, because the blue light wavelength from LED chip will change along with different temperatures, the color control of the white light is difficult. In addition, the two-wavelength white light lacks red light, thereby reducing the color rendering.

The third white illumination device is formed by blue, green, and red phosphors evenly dispersed in optical gel. By excitation, the phosphors emit red, green, and blue lights which further collocate to provide a three-wavelength white light. Although the luminescence efficiency thereof is relatively lower, the three-wavelength white light has higher color rendering. The manufacturing flexibility and properties of the third white illumination device is comparably advantageous over the first and second commonly found white illumination devices. Most phosphors are sulfides, nitrides, or oxides. Because sulfide phosphors usually have high luminescence efficiency but low stability, they are easily degraded by moisture or oxygen. On the other hand, the nitride phosphors have high stability, but the synthesis of the nitrides is difficult such as in high temperature/pressure condition, thereby increasing costs and risks. The most general phosphors are oxides such as silicates or aluminates etc., but suitable silicate red phosphors are scarce at present. Therefore, an invention for a good silicate red phosphor is needed and further applied in white illumination devices.

SUMMARY OF THE INVENTION

The invention provides a red phosphor, comprising $M(Eu_{1-x-y}La_xBi_y)_4Si_3O_{13}$. M is Ca, Sr, Ba, or combinations thereof, $0<x<1$, and $0<y<1$.

The invention also provides a white light illumination device, comprising the described red phosphor, a blue phosphor, a green phosphor, and an excitation light source.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
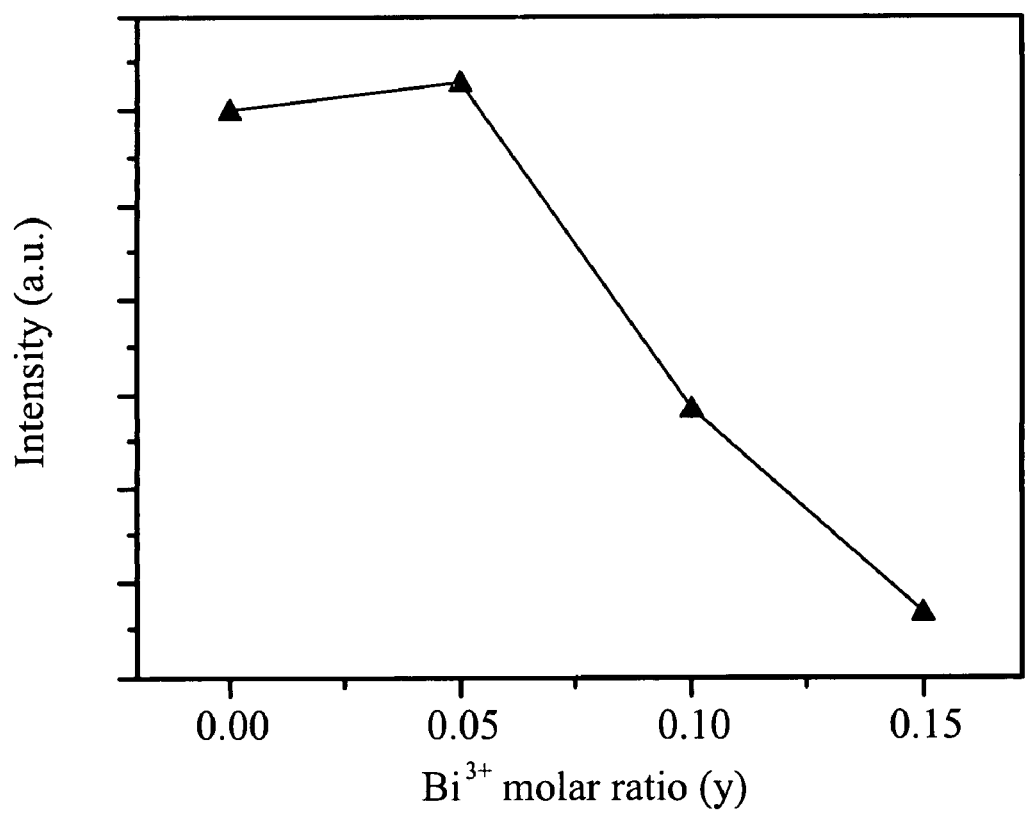
FIG. 1 shows the luminescence intensities of $Ca(Eu_{0.2}La_{0.80-x}Bi_x)_4Si_3O_{13}$ with different doped ratio of $Bi^{3+}$ in Examples 1-4 in the invention.

The following description is of the best-contemplated mode of carrying out the invention. This description is made for the purpose of illustrating the general principles of the invention and should not be taken in a limiting sense. The scope of the invention is best determined by reference to the appended claims.

For solving the shortcomings such as difficult synthesis or poor stability of red phosphors, the invention provides a red phosphor, comprising $M(Eu_{1-x-y}La_xBi_y)_4Si_3O_{13}$. Wherein M is Ca, Sr, Ba, or combinations thereof, $0<x<1$, and $0<y<1$. The cation of the red phosphor is silicate $[Si_3O_{13}]^{14-}$ comprising a different structure compared to general silicate $[SiO_4]^{4-}$. The anion of the red phosphor includes one parts by mole of a bivalent element (such as $Ca^{2+}$, $Sr^{2+}$, $Ba^{2+}$, or combinations thereof) and four parts by mole of a mixture of trivalent element (such as $Eu^{3+}$, $La^{3+}$, and $Bi^{3+}$). The preferred molar ratio of the mixture of $Eu^{3+}$, $La^{3+}$, and $Bi^{3+}$ can be 0.15-0.25 parts by mole of $Eu^{3+}$, 0.7-0.8 parts by mole of $La^{3+}$, and 0.03-0.10 parts by mole of $Bi^{3+}$. In a further embodiment of the invention, the molar ratio of the mixture can be 0.20 parts by mole of $Eu^{3+}$, 0.75 parts by mole of $La^{3+}$, and 0.05 parts by mole of $Bi^{3+}$.

The described red phosphor is prepared by sintering. First, an appropriate molar ratio, weighted corresponding to stoichiometry, of $Eu_2O_3$, $La_2O_3$, $Bi_2O_3$, $CaCO_3$, $SrCO_3$, $BaCO_3$, and $SiO_2$ are evenly mixed and grinded, charged in a crucible, and than heated in a high temperature furnace. After sintering at 1200-1400° C. for 8-12 hours, the red phosphor of the invention is prepared. Excited by ultraviolet light of 392±2 nm or blue light of 460 nm, the red phosphor will emit a red light comprising a major emission peak of 613 nm. The red light has a color coordinate on a CIE scale, wherein the color coordinate has an x value of 0.63 to 0.64 and a y value of 0.34 to 0.35. Because appropriately doped with $Bi^{3+}$, the red phosphor of the invention has a higher light intensity than a red phosphor without $Bi^{3+}$ of 10-15%.

Because the red phosphor can be excited by a blue light, the red phosphor and a green phosphor such as $BaMgAl_{10}O_{17}$:$Eu^{2+}$, $Mn^{2+}$ or ZnS:Cu, Al can be mixed and dispersed in an optical gel and excited by a blue LED. The blue light passing through the optical gel, the red light emitted from the red phosphor, and a green light emitted from a green phosphor are collocated to form a white light with better color rendering. If ultraviolet light is adopted as the excitation light source of the red phosphor of the invention, the red phosphor and the described green phosphor, and a blue phosphor such as $BaMgAl_{10}O_{17}$:$Eu^{2+}$ or ZnS:Ag, Cl can be mixed and dispersed in an optical gel and excited by an ultraviolet light. The red, green, and blue light emitted from the red, green, and blue phosphor, respectively, collocated to form a white light. Note that if ultraviolet light is adopted, an ultraviolet filter should be disposed on the outside of the white illumination device to prevent damage to user's eye. The described excitation light source can be LED, laser diode, or other suitable light sources.

EXAMPLE 1

280 mg of $Eu_2O_3$ (0.8 mmol, commercially available from Aldrich Chemicals Company Inc. in U.S.A., 99.9%, FW=351.93), 1.04 g of $La_2O_3$ (3.2 mmol, commercially available from Aldrich Chemicals Company Inc. in U.S.A., 99.99%, FW=325.81), 100 mg of $CaCO_3$ (1 mmol, commercially available from Aldrich Chemicals Company Inc. in U.S.A., 99+%, FW=100.09), and 180 mg of $SiO_2$ (3 mmol, commercially available from Aldrich Chemicals Company Inc. in U.S.A., 99.6%, FW=60.08) were evenly mixed and grinded, charged in a crucible, and than heated in a high temperature furnace. After sintering at 1200-1400° C. for 8-12 hours, 1.50 g of red phosphor $Ca(Eu_{0.2}La_{0.8})_4Si_3O_{13}$ was prepared. In Example 1, the theoretical yield in weight is 1.56 g and the yield is 96.1%. After excited by an ultraviolet light of 393 nm, the describe product emitted a red light having luminescence intensity of $1.019*10^7$ cps as shown in FIG. 1.

EXAMPLE 2

Figure 2:
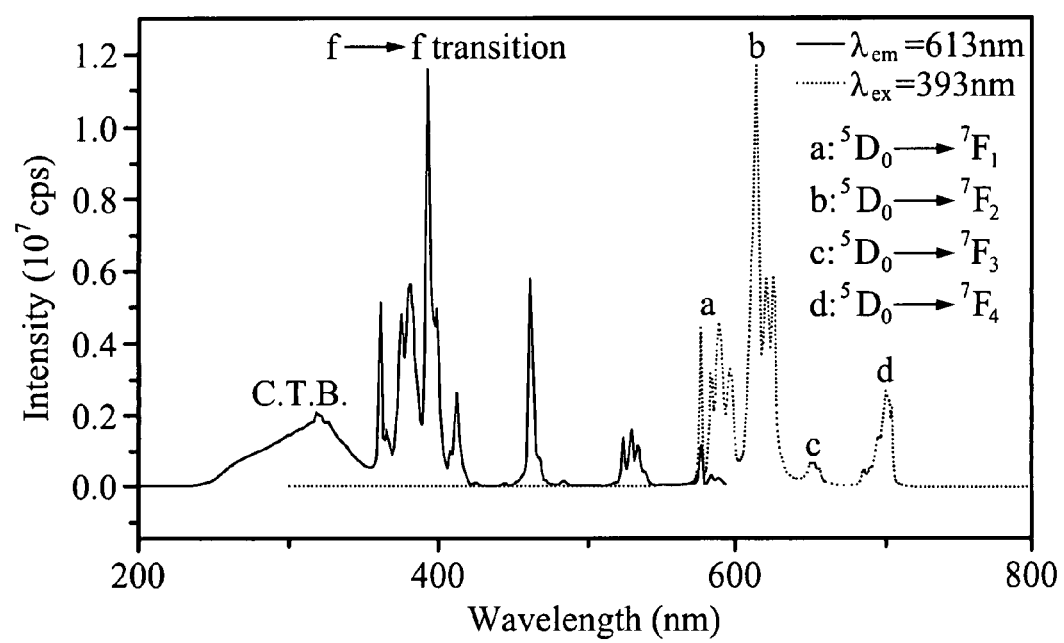
FIG. 2 shows the emission spectrum of $Ca(Eu_{0.2}La_{0.75}Bi_{0.05})_4Si_3O_{13}$ excited by an ultraviolet light.

280 mg of $Eu_2O_3$ (0.8 mmol, commercially available from Aldrich Chemicals Company Inc. in U.S.A., 99.9%, FW=351.93), 977 mg of $La_2O_3$ (3 mmol, commercially available from Aldrich Chemicals Company Inc. in U.S.A., 99.99%, FW=325.81), 93 mg of $Bi_2O_3$ (0.2 mmol, commercially available from CERAC Chemicals Company Inc. in U.S.A., 99.9%, FW=465.96), 100 mg of $CaCO_3$ (1 mmol, commercially available from Aldrich Chemicals Company Inc. in U.S.A., 99+%, FW=100.09), and 180 mg of $SiO_2$ (3 mmol, commercially available from Aldrich Chemicals Company Inc. in U.S.A., 99.6%, FW=60.08) were evenly mixed and grinded, charged in a crucible, and than heated in a high temperature furnace. After sintering at 1200-1400° C. for 8-12 hours, 1.51 g of red phosphor $Ca(Eu_{0.2}La_{0.75}Bi_{0.05})_4Si_3O_{13}$ was prepared. In Example 2, the theoretical yield in weight is 1.58 g and the yield is 95.6%. After excited by an ultraviolet light of 393 nm, the describe product emitted a red light having luminescence intensity of $1.169*10^7$ cps as shown in FIG. 1. The full spectrum of Example 2 is shown in FIG. 2. Most 400 nm and below results are within the f-f transfer band and charge transfer band, and the major emission peak is the red light of 613 nm.

EXAMPLE 3

280 mg of $Eu_2O_3$ (0.8 mmol, commercially available from Aldrich Chemicals Company Inc. in U.S.A., 99.9%, FW=351.93), 912 mg of $La_2O_3$ (2.8 mmol, commercially available from Aldrich Chemicals Company Inc. in U.S.A., 99.99%, FW=325.81), 186 mg of $Bi_2O_3$ (0.4 mmol, commercially available from CERAC Chemicals Company Inc. in U.S.A., 99.9%, FW=465.96), 100 mg of $CaCO_3$ (1 mmol, commercially available from Aldrich Chemicals Company Inc. in U.S.A., 99+%, FW=100.09), and 180 mg of $SiO_2$ (3 mmol, commercially available from Aldrich Chemicals Company Inc. in U.S.A., 99.6%, FW=60.08) were evenly mixed and grinded, charged in a crucible, and than heated in a high temperature furnace. After sintering at 1200-1400° C. for 8-12 hours, 1.54 g of red phosphor $Ca(Eu_{0.2}La_{0.7}Bi_{0.1})_4Si_3O_{13}$ was prepared. In Example 3, the theoretical yield in weight is 1.61 g and the yield is 95%. After excited by an ultraviolet light of 393 nm, the describe product emitted a red light having luminescence intensity of $6.207*10^6$ cps as shown in FIG. 1.

EXAMPLE 4

280 mg of $Eu_2O_3$ (0.8 mmol, commercially available from Aldrich Chemicals Company Inc. in U.S.A., 99.9%, FW=351.93), 847 mg of $La_2O_3$ (2.6 mmol, commercially available from Aldrich Chemicals Company Inc. in U.S.A., 99.99%, FW=325.81), 280 mg of $Bi_2O_3$ (0.6 mmol, commercially available from CERAC Chemicals Company Inc. in U.S.A., 99.9%, FW=465.96), 100 mg of $CaCO_3$ (1 mmol, commercially available from Aldrich Chemicals Company Inc. in U.S.A., 99+%, FW=100.09), and 180 mg of $SiO_2$ (3 mmol, commercially available from Aldrich Chemicals Company Inc. in U.S.A., 99.6%, FW=60.08) were evenly mixed and grinded, charged in a crucible, and than heated in a high temperature furnace. After sintering at 1200-1400° C. for 8-12 hours, 1.55 g of red phosphor $Ca(Eu_{0.2}La_{0.7}Bi_{0.1})_4Si_3O_{13}$ was prepared. In Example 4, the theoretical yield in weight is 1.64 g and the yield is 94.51%. After excited by an ultraviolet light of 393 nm, the describe product emitted a red light having luminescence intensity of $3.469*10^6$ cps as shown in FIG. 1.

Referring to FIG. 1, the red phosphor doped with 0.05 parts by weight of $Bi^{3+}$ has a higher light intensity than a red phosphor without $Bi^{3+}$ of 10-15%. However, the premise is that the red phosphor has 0.2 parts by mole of $Eu^{3+}$. While changing the parts by mole of $Eu^{3+}$ or $La^{3+}$, the preferably parts by mole of $Bi^{3+}$ may be higher or lower than 0.05. Compared to the red phosphor Kasei P22-RE3 ($Y_2O_2S$:$Eu^{3+}$, commercially available from Kasei Optonix, Ltd.), the luminescence intensity of the red phosphor of the invention has achieved 70% of Kasei P22-RE3. Furthermore, the invention is free of the shortcomings caused by sulfide such as low stability and easy degradation by moisture and oxygen. The appropriately doped $Bi^{3+}$ may improve the luminescence intensity of the red phosphor of the invention.

While the invention has been described by way of example and in terms of the preferred embodiments, it is to be understood that the invention is not limited to the disclosed embodi-

What is claimed is:

1. A red phosphor, comprising:

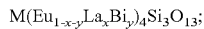
$M(Eu_{1-x-y}La_xBi_y)_4Si_3O_{13}$;

wherein M is Ca, Sr, Ba, or combinations thereof; 0<x<1; and 0<y<1.

2. The red phosphor as claimed in claim 1, wherein x ranges from 0.7 to 0.8, and y ranges from 0.03 to 0.10.

3. The red phosphor as claimed in claim 1, wherein x is about 0.75, and y is about 0.05.

4. The red phosphor as claimed in claim 1 is excited by an ultraviolet light of 393±2 nm or a blue light of 460 nm.

5. The red phosphor as claimed in claim 1 is excited by a light emitting diode or a laser diode.

6. The red phosphor as claimed in claim 1 emits a red light having a major emission peak of 613 nm.

7. The red phosphor as claimed in claim 1 emits a red light having a color coordinate on a CIE scale, wherein the color coordinate has an x value of 0.63 to 0.64 and a y value of 0.34 to 0.35.

8. The red phosphor as claimed in claim 1 has a sintering temperature of about 1200 to 1400° C. and a sintering time of about 8 to 12 hours.

9. A white light illumination device, comprising:

the red phosphor as claimed in claim 1;

a blue phosphor;

a green phosphor; and an excitation light source.

10. The white light illumination device as claimed in claim 9, wherein the blue phosphor comprises $BaMgAl_{10}O_{17}:Eu^{2+}$ or ZnS:Ag, Cl.

11. The white light illumination device as claimed in claim 9, wherein the green phosphor comprises $BaMgAl_{10}O_{17}: Eu^{2+}, Mn^{2+}$ or ZnS:Cu, Al.

12. The white light illumination device as claimed in claim 9, wherein the excitation light source is an ultraviolet light of 393±2 nm or a blue light of 460 nm.

13. The white light illumination device as claimed in claim 9, wherein the excitation light source is a light emitting diode or a laser diode.

* * * * *